(12) United States Patent
Yoneoka et al.

(10) Patent No.: US 9,340,414 B2
(45) Date of Patent: May 17, 2016

(54) METHOD AND STRUCTURE OF MONOLITHICALLY INTEGRATED ABSOLUTE PRESSURE SENSOR

(71) Applicant: mCube Inc., San Jose, CA (US)

(72) Inventors: Shingo Yoneoka, San Jose, CA (US); Anthony F. Flannery, Jr., San Jose, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 14/311,034

(22) Filed: Jun. 20, 2014

(65) Prior Publication Data
US 2015/0315016 A1    Nov. 5, 2015

Related U.S. Application Data

(60) Provisional application No. 61/838,833, filed on Jun. 24, 2013.

(51) Int. Cl.
*B81C 1/00* (2006.01)
*B81B 7/02* (2006.01)

(52) U.S. Cl.
CPC ............. *B81C 1/00246* (2013.01); *B81B 7/02* (2013.01); *B81C 1/00269* (2013.01); *B81B 2201/0264* (2013.01)

(58) Field of Classification Search
CPC ............ B81C 1/00269; B81C 1/00301; B81C 1/00333
USPC ......................................................... 257/415
See application file for complete search history.

(56) References Cited

U.S. PATENT DOCUMENTS

| 6,159,762 | A * | 12/2000 | Scheiter | G01L 9/0073 257/415 |
| 8,748,998 | B2 * | 6/2014 | Frey | G01P 15/0802 257/415 |
| 2006/0071324 | A1 * | 4/2006 | Lu | B81C 1/00269 257/704 |
| 2008/0099862 | A1 * | 5/2008 | Fujii | B81C 1/00269 257/417 |
| 2008/0308920 | A1 | 12/2008 | Wan | |
| 2009/0108381 | A1 * | 4/2009 | Buchwalter | B81C 1/0023 257/415 |
| 2010/0044808 | A1 | 2/2010 | Dekker et al. | |
| 2010/0075481 | A1 | 3/2010 | Yang | |
| 2010/0224994 | A1 * | 9/2010 | Yun | B81C 1/00269 257/741 |
| 2010/0270630 | A1 * | 10/2010 | Fujii | B81B 7/007 257/415 |
| 2011/0062532 | A1 | 3/2011 | Wang | |
| 2012/0032283 | A1 * | 2/2012 | Frey | G01P 15/0802 257/415 |
| 2012/0086087 | A1 * | 4/2012 | Fitzpatrick | H01L 27/1203 257/416 |
| 2013/0043510 | A1 * | 2/2013 | Shu | B81C 1/00269 257/254 |
| 2015/0191345 | A1 * | 7/2015 | Boysel | B81B 7/007 257/774 |

FOREIGN PATENT DOCUMENTS

TW    200711545 A    3/2007

OTHER PUBLICATIONS

Taiwan Patent Office Office Action for patent application TW103121771 (Sep. 3, 2015), with English translation, 8 pages.

* cited by examiner

*Primary Examiner* — Allan R Wilson
(74) *Attorney, Agent, or Firm* — Kilpatrick Townsend & Stockton LLP

(57) ABSTRACT

An integrated pressure sensing device and method of fabrication thereof are disclosed. The method can include providing a substrate member having a surface region and forming a CMOS IC layer overlying the substrate and forming an oxide layer overlying the CMOS IC layer. A portion of the oxide layer can be removed to form a cavity region. A single crystalline silicon wafer can be bonded overlying the oxide surface region to seal the cavity region. The bonding process can include a fusion bonding or eutectic bonding process. The wafer can be thinned to a desired thickness and portions can be removed and filled with metal materials to form via structures. A pressure sensor device can be formed from the wafer, and can be co-fabricated with another sensor from the wafer. The pressure sensor and the other sensor can share a cavity pressure or have separate cavity pressures.

22 Claims, 10 Drawing Sheets

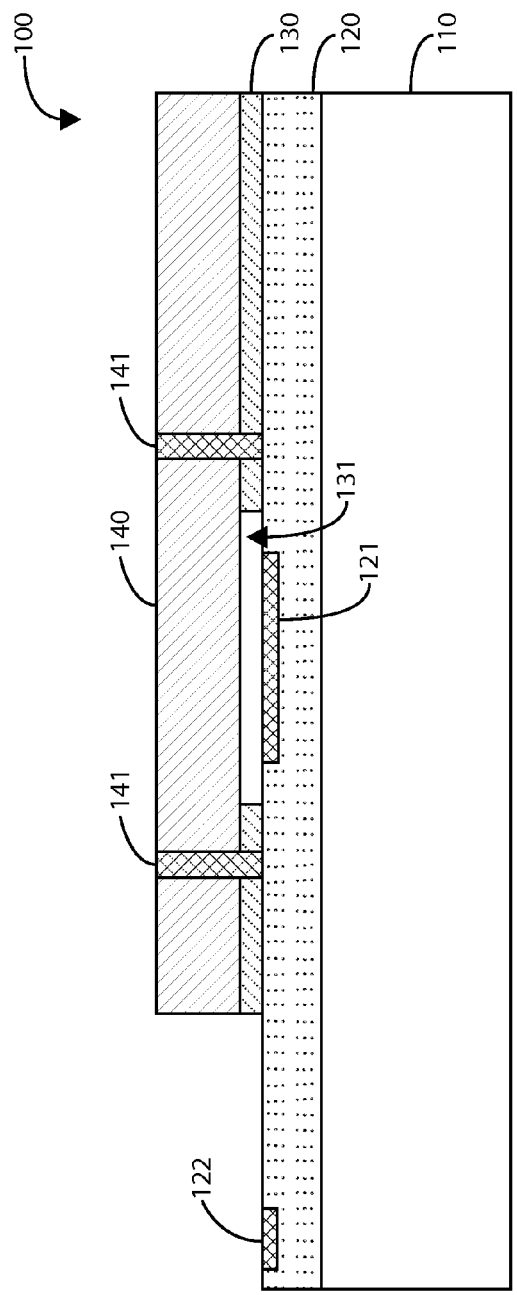
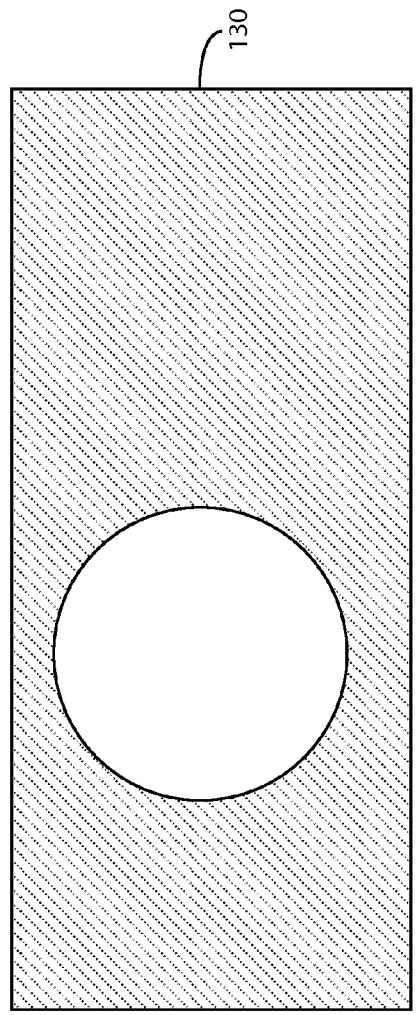
FIG. 1A
FIG. 1B

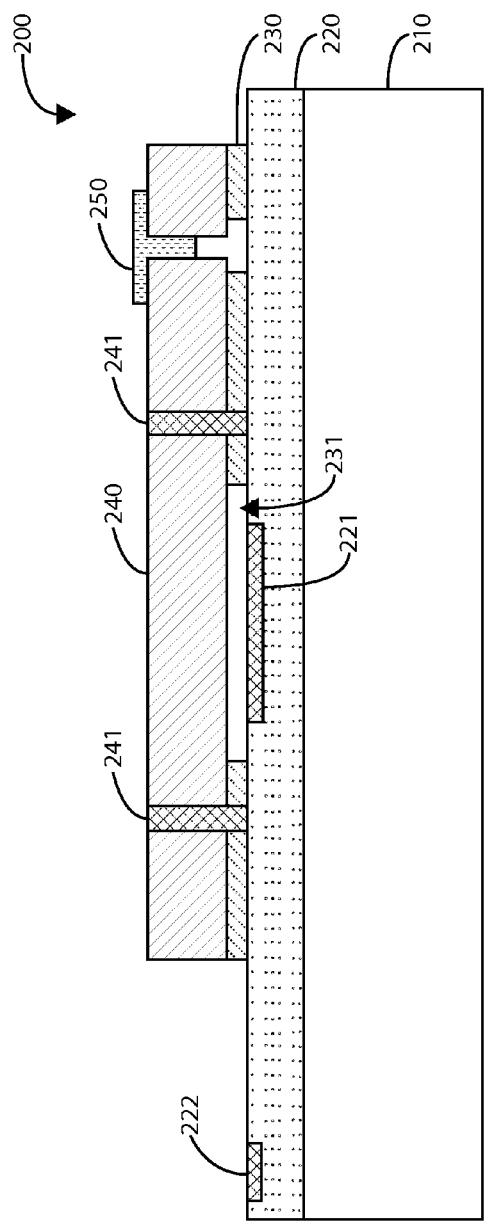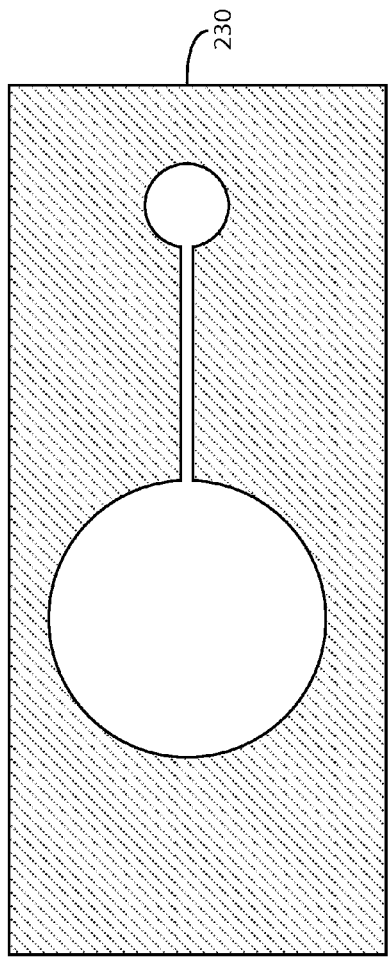
FIG. 2A
FIG. 2B

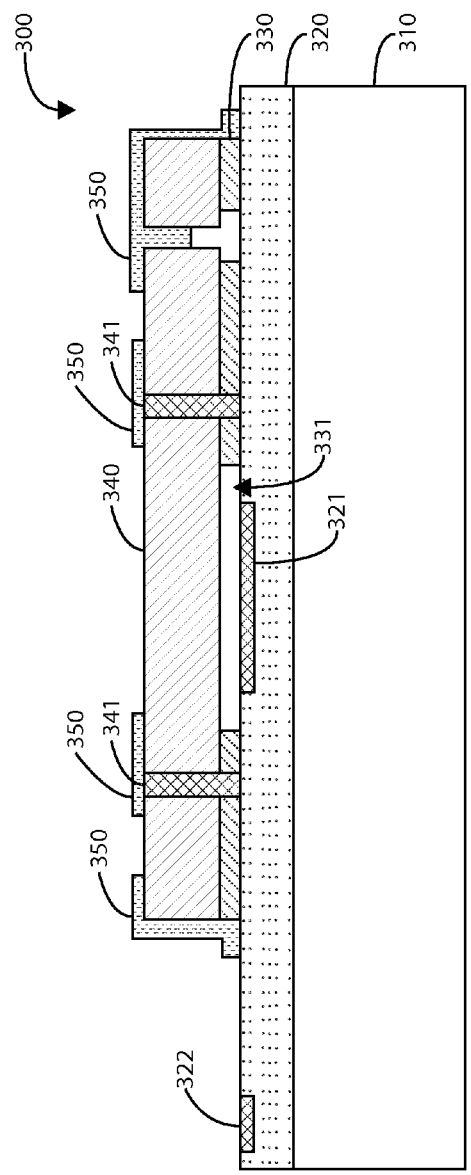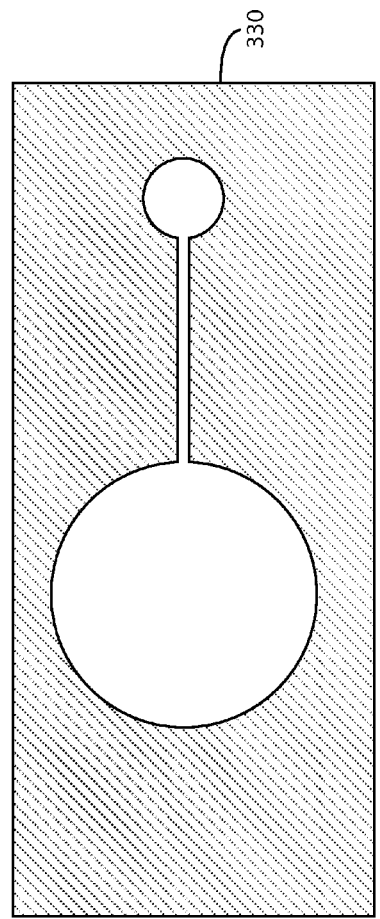
FIG. 3A
FIG. 3B

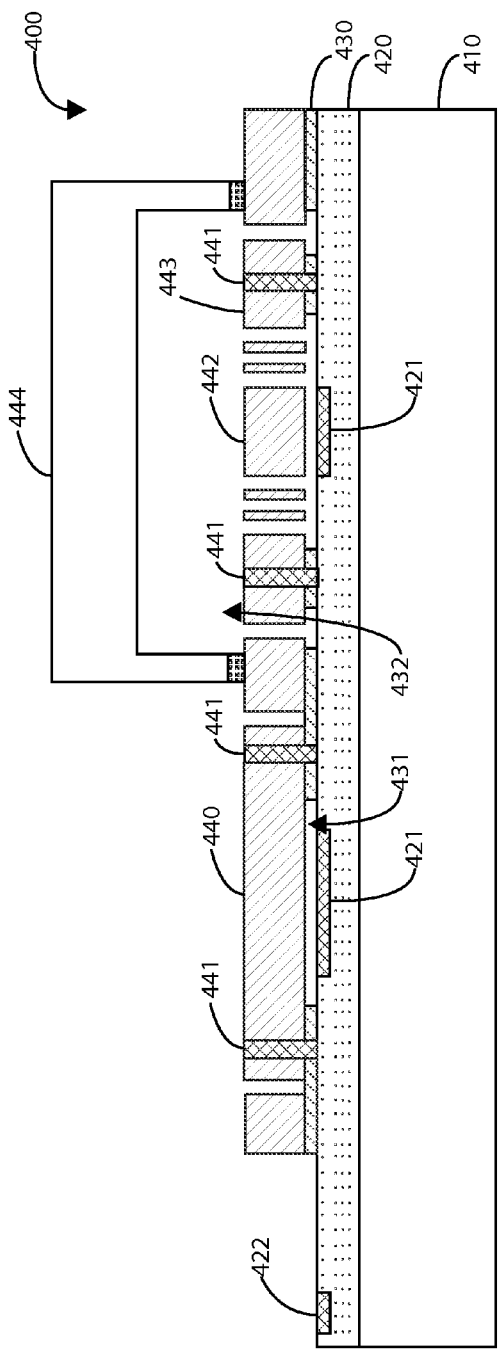
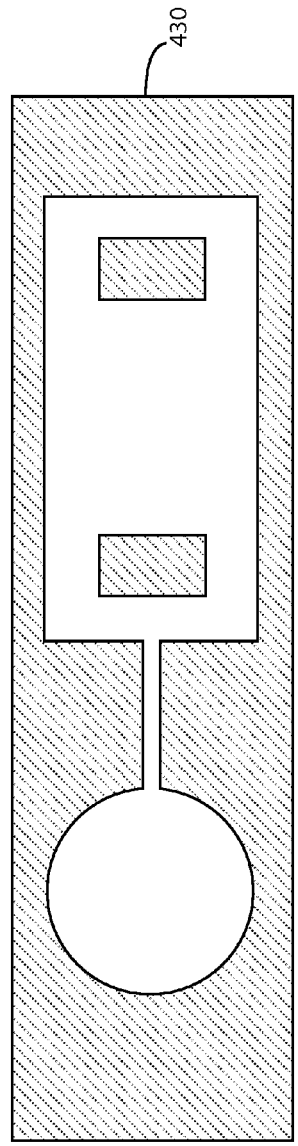
FIG. 4A
FIG. 4B

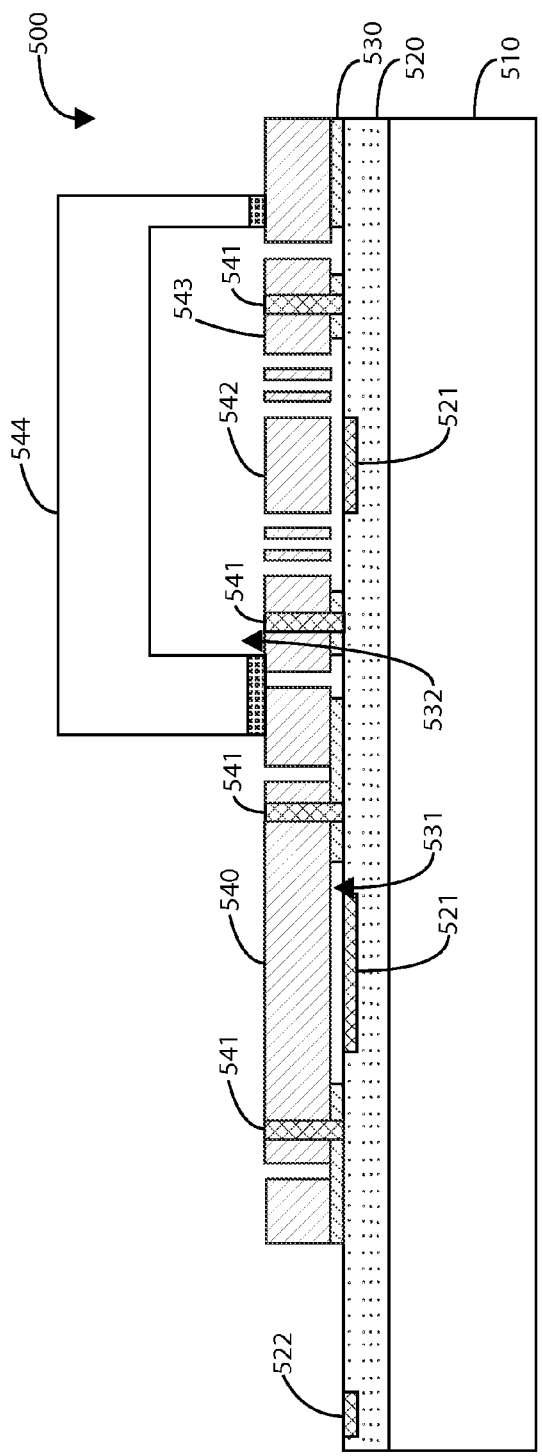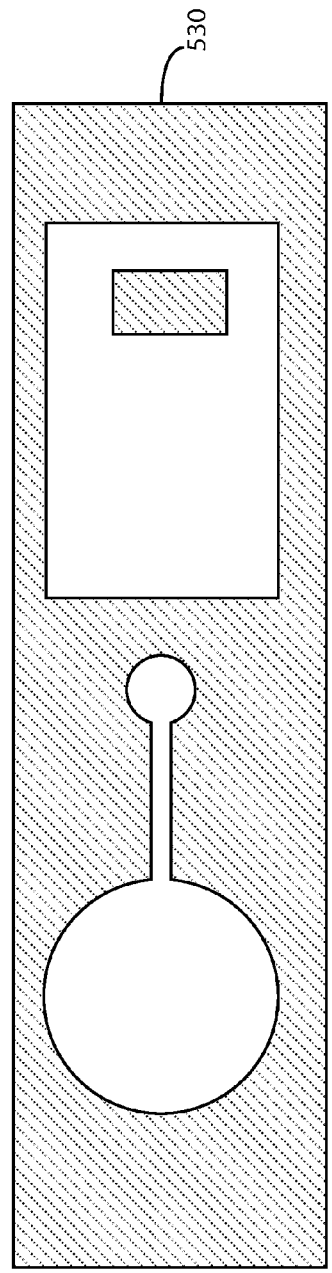

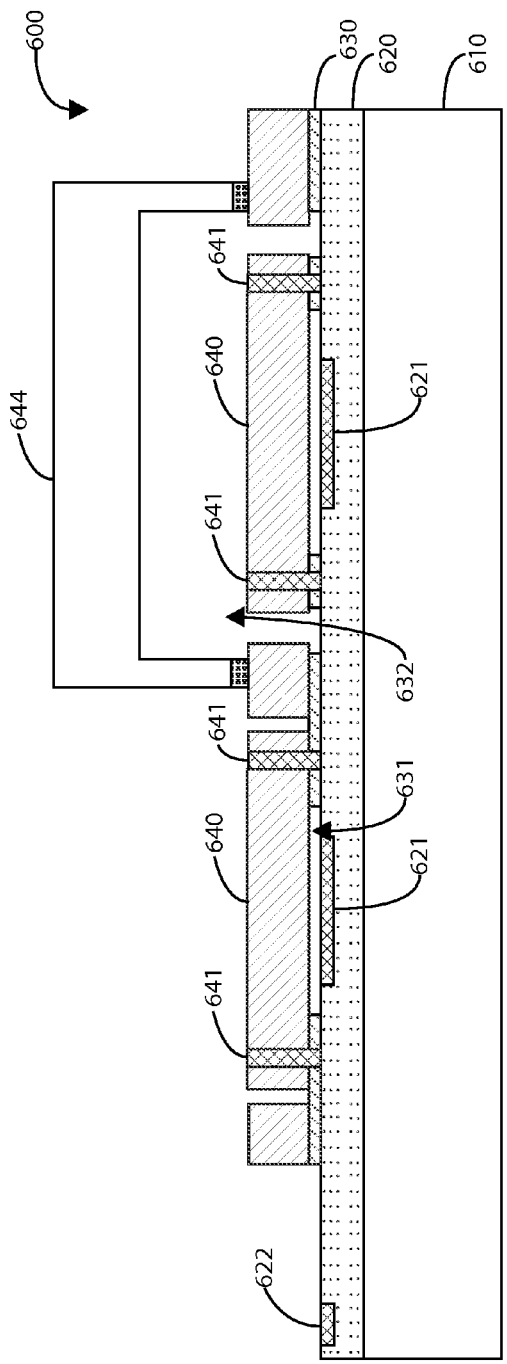
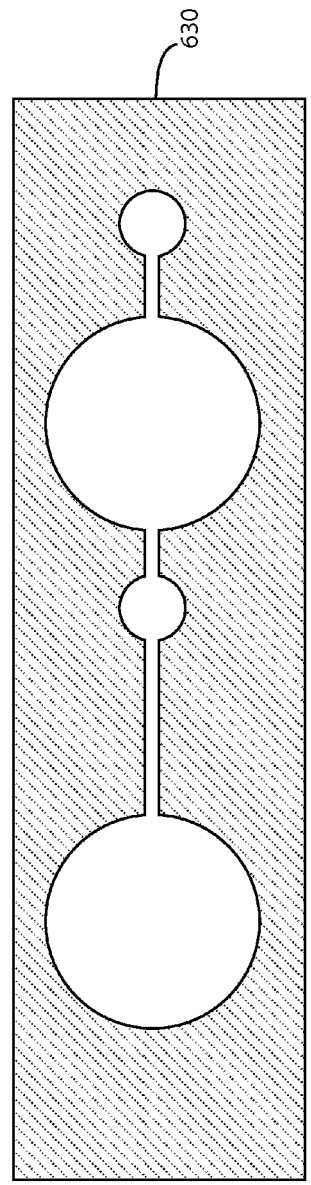
FIG. 6A
FIG. 6B

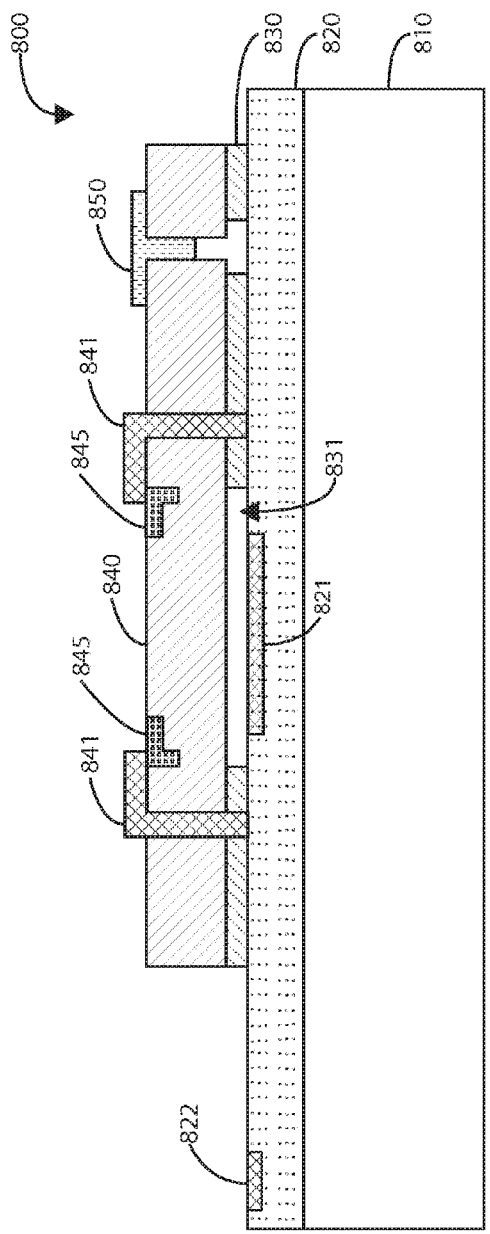
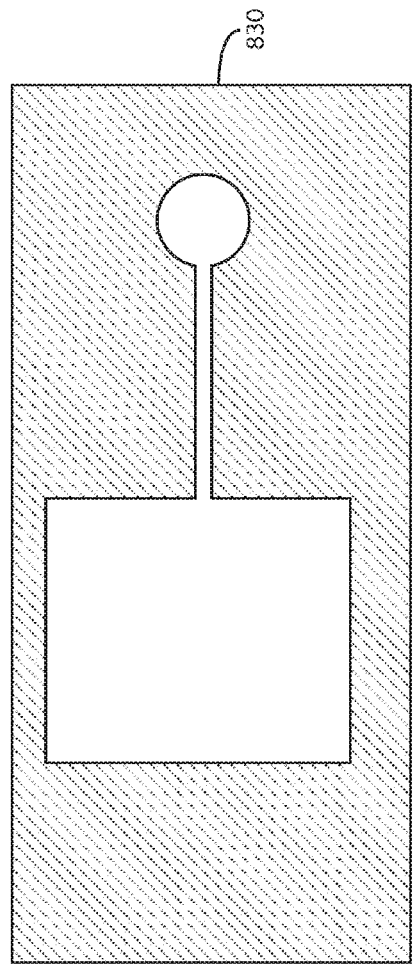

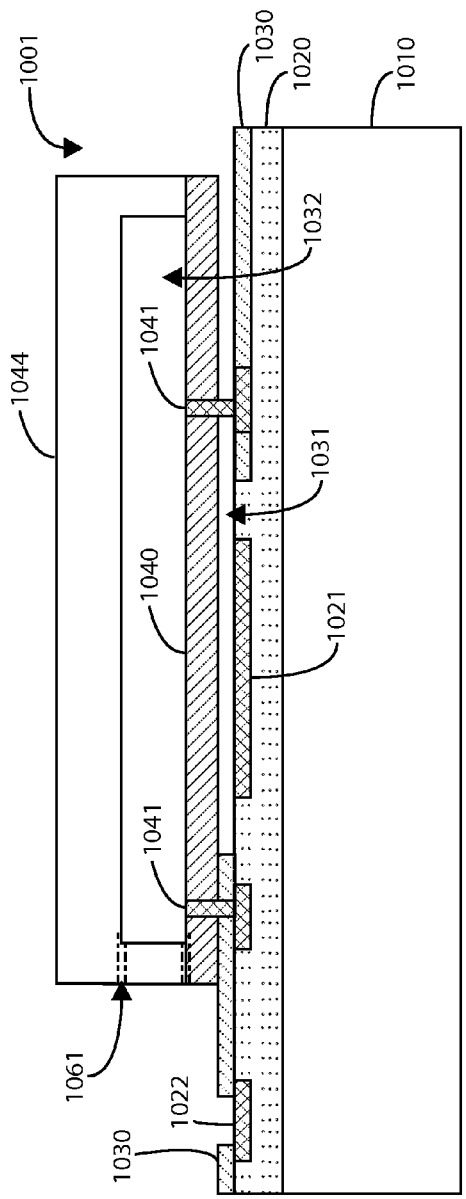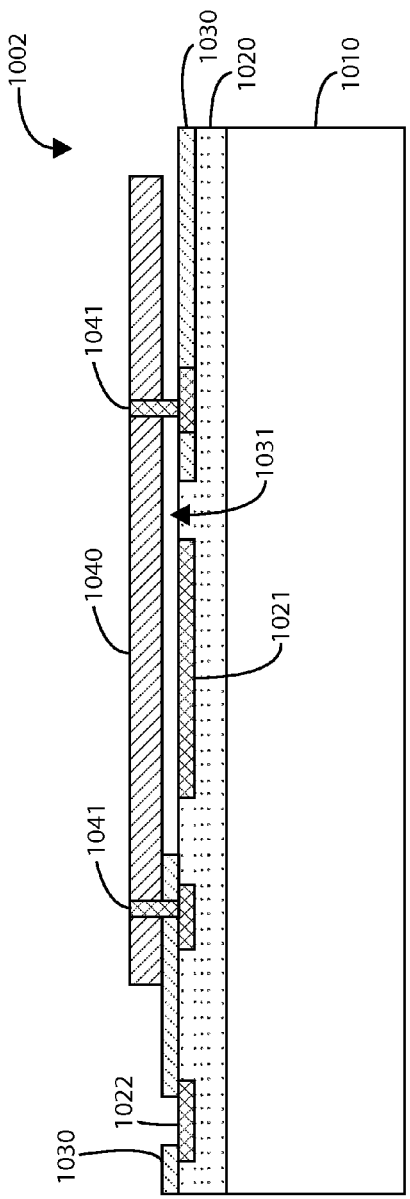
FIG. 10A
FIG. 10B

METHOD AND STRUCTURE OF MONOLITHICALLY INTEGRATED ABSOLUTE PRESSURE SENSOR

CROSS-REFERENCES TO RELATED APPLICATIONS

The present application claims priority to and incorporates by reference, for all purposes, the following provisional application: U.S. Provisional App. 61/838,833, filed Jun. 24, 2013. The present application also incorporates by reference, for all purposes, the following pending patent applications: U.S. patent application Ser. No. 12/717,070, filed Mar. 3, 2010, U.S. patent application Ser. No. 13/494,986, filed Jun. 12, 2012, and U.S. patent application Ser. No. 12/499,027, filed Jul. 7, 2009.

BACKGROUND OF THE INVENTION

The present invention is directed to MEMS (Micro-Electro-Mechanical-Systems). More specifically, embodiments of the invention provide methods and structure for improving integrated MEMS devices, including pressure sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™device by Apple, Inc. of Cupertino, Calif., and the Blackberry™phone by Research In Motion Limited of Waterloo, Ontario, Canada, and accelerometers in sensor-equipped game devices, such as those in the Wii™controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods and structure for improving integrated MEMS devices, including pressure sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

In various embodiments, the present invention provides methods and structures of monolithically integrated absolute pressure sensors using IC foundry-compatible processes. In an embodiment, the CMOS substrate is first fabricated using a standard IC process. A diaphragm of a pressure sensor is formed from a single crystalline silicon material that is layer transferred to the CMOS substrate. At least one capacitive or piezoresistive pressure sensors can be formed. The present invention provides multiple methods of fabricating a capacitive and piezoresistive pressure sensor devices are provided.

In an embodiment, the present invention provides an method for fabricating an integrated MEMS pressure sensor device. The method can include providing a substrate member having a surface region and forming a CMOS IC layer overlying the substrate and forming an oxide layer overlying the CMOS IC layer. A portion of the oxide layer can be removed to form a cavity region. A single crystalline silicon wafer can be bonded overlying the oxide surface region to seal the cavity region. The bonding process can include a fusion bonding or eutectic bonding process. The wafer can be thinned to a desired thickness and portions can be removed and filled with metal materials to form via structures. A pressure sensor device can be formed from the wafer, and can be co-fabricated with another sensor from the wafer. The pressure sensor and the other sensor can share a cavity pressure or have separate cavity pressures.

Many benefits are achieved by way of embodiments of the present invention over conventional techniques. For example, embodiments of the present invention provide an integrated MEMS pressure sensor device having structural flexibility with other sensor devices. Smaller die sizes and lower parasitic capacitance of the device can be achieved due to the monolithic integration of MEMS and CMOS on a single chip. Additionally, the method provides a process and system that are compatible with conventional semiconductor and MEMS process technologies without substantial modifications to conventional equipment and processes. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1A is a simplified diagram illustrating a cross-sectional view of an integrated pressure sensor device according to an embodiment of the present invention.

FIG. 1B is a simplified diagram illustrating a top view of an oxide layer of the integrated pressure sensor device according to the embodiment of FIG. 1A.

FIG. 2A is a simplified diagram illustrating a cross-sectional view of an integrated pressure sensor device according to an embodiment of the present invention.

FIG. 2B is a simplified diagram illustrating a top view of an oxide layer of the integrated pressure sensor device according to the embodiment of FIG. 2A.

FIG. 3A is a simplified diagram illustrating a cross-sectional view of an integrated pressure sensor device according to an embodiment of the present invention.

FIG. 3B is a simplified diagram illustrating a top view of an oxide layer of the integrated pressure sensor device according to the embodiment of FIG. 3A.

FIG. 4A is a simplified diagram illustrating a cross-sectional view of an integrated pressure sensor device according to an embodiment of the present invention.

FIG. 4B is a simplified diagram illustrating a top view of an oxide layer of the integrated pressure sensor device according to the embodiment of FIG. 4A.

FIG. 5A is a simplified diagram illustrating a cross-sectional view of an integrated pressure sensor device according to an embodiment of the present invention.

FIG. 5B is a simplified diagram illustrating a top view of an oxide layer of the integrated pressure sensor device according to the embodiment of FIG. 5A.

FIG. 6A is a simplified diagram illustrating a cross-sectional view of an integrated pressure sensor device according to an embodiment of the present invention.

FIG. 6B is a simplified diagram illustrating a top view of an oxide layer of the integrated pressure sensor device according to the embodiment of FIG. 6A.

FIG. 8A is a simplified diagram illustrating a cross-sectional view of an integrated pressure sensor device according to an embodiment of the present invention.

FIG. 8B is a simplified diagram illustrating a top view of an oxide layer of the integrated pressure sensor device according to the embodiment of FIG. 8A.

FIG. 10A is a simplified diagram illustrating a cross-sectional view of an integrated pressure sensor device according to an embodiment of the present invention.

FIG. 10B is a simplified diagram illustrating a cross-sectional view of an integrated pressure sensor device according to an embodiment of the present invention.

DETAILED DESCRIPTION OF THE INVENTION

Figure 7A:
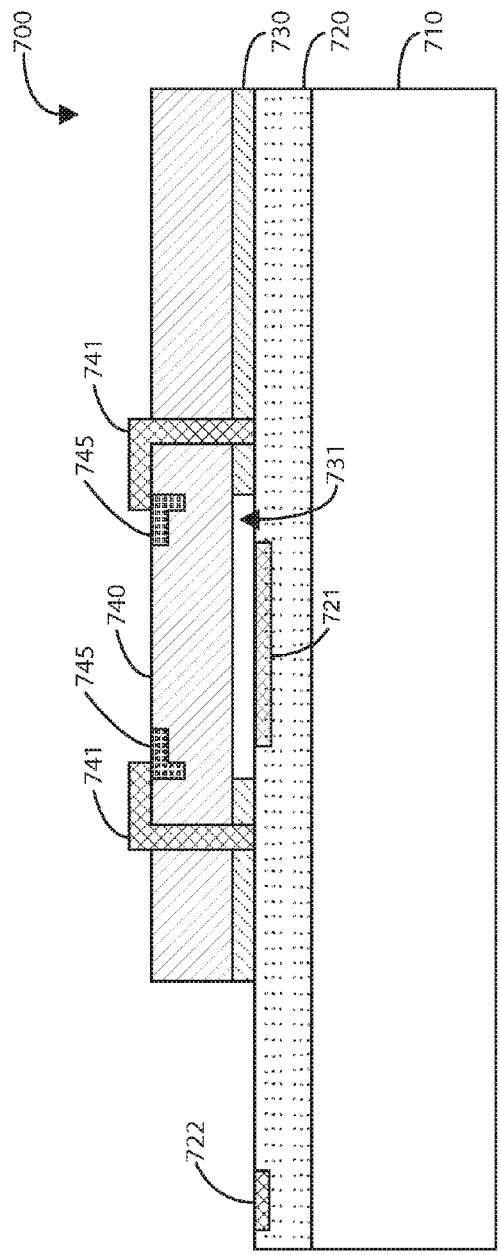
FIG. 7A is a simplified diagram illustrating a cross-sectional view of an integrated pressure sensor device according to an embodiment of the present invention.

The present invention is directed to MEMS (Micro-Electro-Mechanical-Systems). More specifically, embodiments of the invention provide methods and structures for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

FIG. 1A is a simplified diagram illustrating a cross-sectional view of an integrated pressure sensor device according to an embodiment of the present invention. This figure can represent a method of fabricating an integrated capacitive pressure sensing device using fusion bonding. The integrated pressure sensing device 100 includes a pressure sensor (diaphragm) 140 integrated overlying a processed CMOS substrate (CMOS layers 120 overlying substrate 110) having at least a bond pad 122 and at least a top metal layer 121. The pressure sensor 140 can also have one or more via structures 141 coupled to the CMOS layers 120. Those of ordinary skill in the art will recognize other variations, modifications, and alternatives.

As shown, a pressure sensor 140 is formed overlying a CMOS substrate, which can be fabricated using a standard IC process, including bond pads 122 and top metal layers 121. After patterning the top metal layer, an oxide layer 130 can be deposited and patterned. At least a region of the oxide layer 130 overlying the top metal layers 121 can be removed to create a cavity region 131. In an embodiment, the oxide layer 130 can be part of the CMOS layers 120.

A single crystalline silicon (SCS) wafer can be fusion bonded with the CMOS substrate within a vacuum chamber, which can form a vacuum in the cavity region 131 between the CMOS and the SCS layer. The SCS layer can be thinned down to about 20-30 um to form a diaphragm structure of a pressure sensor 140. The SCS layer can be etched to create holes, which can be filled with metal materials 141 (ex. TiN and W) to form electrical connections between the SCS layer and the CMOS layer 120. The etching process can include a plasma etching, chemical vapor etching, deep reactive ion etching (DRIE), or other like process.

FIG. 1B is a simplified diagram illustrating a top view of an oxide layer 130 of the integrated pressure sensor device according to the embodiment of FIG. 1A. The oxide layer is shown with a substantially circular region removed, which corresponds to the region overlying the top metal layers shown in FIG. 1A.

FIG. 2A is a simplified diagram illustrating a cross-sectional view of an integrated pressure sensor device according to an embodiment of the present invention. This figure can represent a method of fabricating an integrated capacitive pressure sensing device 200 using a seal via thin film deposition. The integrated pressure sensing device includes a pressure sensor (diaphragm) 240 integrated overlying a processed CMOS substrate (CMOS layers 220 overlying substrate 210) having at least a bond pad 222 and at least a top metal layer 221. The pressure sensor 240 can also have one or more via structures 241 coupled to the CMOS layers 220.

As shown, a pressure sensor 240 is formed overlying a CMOS substrate, which can be fabricated using a standard IC process, including bond pads 222 and top metal layers 221. After patterning the top metal layer 221, an oxide layer 230 can be deposited and patterned. At least a region of the oxide layer 230 overlying the top metal layers 221 can be removed to create a cavity region 231.

A single crystalline silicon (SCS) wafer can be fusion bonded with the CMOS substrate within a vacuum chamber, which can form a vacuum in the cavity region 231 between the CMOS and the SCS layer. The SCS layer can be thinned down to about 20-30 um to form a diaphragm structure of a pressure sensor 240. The SCS layer can be etched to create holes, which can be filled with metal materials 241 (ex. TiN and W) to form electrical connections between the SCS layer and the CMOS layer 220. The etching process can include a plasma etching, chemical vapor etching, deep reactive ion etching (DRIE), or other like process.

Following the etching process, the cavity 231 of the pressure sensor is opened. In a specific embodiment, a dry cleaning process is used to remove a photo resist material used for the etching process. The cavity 231 can be sealed using a thin film deposition process, which determines the cavity pressure within the cavity region 231. The sealing layer 250 is shown overlying one of the holes in the SCS layer in FIG. 2A. The pressure and temperature of the deposition process can be less than about 1000 Pa and less than about 350 degrees Celsius. The thin film material can include PECVD (Plasma-enhanced chemical vapor deposition) silicon nitride or $SiO_2$ or the like. The silicon nitride material can provide a good diffusion barrier.

FIG. 2B is a simplified diagram illustrating a top view of an oxide layer 230 of the integrated pressure sensor device according to the embodiment of FIG. 2A. The oxide layer 230 is shown with two substantially circular regions connected by a straight path that is removed, which correspond to the regions overlying the top metal layers and underlying the sealing layer, respectively (shown in FIG. 2A).

FIG. 3A is a simplified diagram illustrating a cross-sectional view of an integrated pressure sensor device according to an embodiment of the present invention. This figure illustrates another embodiment of using a thin film deposition process to seal various portions of the device 300 using sealing layers 350, as shown in FIG. 2A. The integrated pressure sensing device 300 includes a pressure sensor (diaphragm) 340 integrated overlying a processed CMOS substrate (CMOS layers 320 overlying substrate 310) having at least a bond pad 322 and at least a top metal layer 321.

In an embodiment, one or more via structures 341 can be formed within a portion of the pressure sensor 340. These via structures 341 or various portions of the oxide layer may provide possible diffusion paths. These diffusion paths or regions can also be sealed using the thin film deposition process described previously. These diffusion regions are shown to be sealed by various sealing layers overlying the sides of the SCS layer, overlying the metal filled vias 341, and overlying the open hole leading to the cavity region 331 (shown in FIG. 3A).

FIG. 3B is a simplified diagram illustrating a top view of an oxide layer 330 of the integrated pressure sensor device according to the embodiment of FIG. 3A. This represents a similar oxide layer as FIG. 2B.

FIG. 4A is a simplified diagram illustrating a cross-sectional view of an integrated pressure sensor device according to an embodiment of the present invention. This figure can represent a method of fabricating an integrated capacitive pressure sensing device using a sealing process with eutectic bonding. The integrated pressure sensing device 400 includes a pressure sensor (diaphragm) 440 integrated overlying a processed CMOS substrate (CMOS layers 420 overlying substrate 410) having at least a bond pad 422 and at least a top metal layer 421. The pressure sensor 440 can also have one or more via structures 441 coupled to the CMOS layers 420. The integrated pressure sensing device can be integrated with at least another sensing device.

The method of fabrication can include steps similar to those described for FIGS. 1A, 1B, 2A, 2B, 3A, and 3B. A standard CMOS-MEMS process can be used. In various embodiments, the design rule can be changed. Similar to FIGS. 2 and 3, the cavity of the pressure sensor 431 can be opened following a Si DRIE etching process. The cavity 431 of the pressure sensor 440 can be sealed during an Al-Ge eutectic bonding process, which defines the cavity pressure.

In FIG. 4A, another sensor 442 is shown adjacent to the pressure sensor 440. This other sensor has a MEMS cap 444 formed overlying. The other sensor 442 can be a MEMS accelerometer, gyrometer, resonator, or other sensor device. The other sensor can also be a dummy or reference pressure sensor for differential measurement. In various embodiments, the other sensor can be co-fabricated with the pressure sensor and have a shared cavity or separate cavities. As shown, sensor 442 can include anchor structures 443. In an embodiment, sensor 442 can have a cavity 432 with a defined air pressure environment. In a specific embodiment, cavity 431 and 432 can have the same cavity pressure.

FIG. 4B is a simplified diagram illustrating a top view of an oxide layer 430 of the integrated pressure sensor device according to the embodiment of FIG. 4A. The oxide layer 430 is shown with two removed portions, one substantially circular and one substantially rectangular, that are connected by a straight path. These regions correspond to the regions underlying the pressure sensor and the other sensor, respectively (shown in FIG. 4A).

FIG. 5A is a simplified diagram illustrating a cross-sectional view of an integrated pressure sensor device according to an embodiment of the present invention. This figure illustrates a method of fabricating an integrated pressure sensing device similar to that of FIG. 4A. The integrated pressure sensing device 500 includes a pressure sensor (diaphragm) 540 integrated overlying a processed CMOS substrate (CMOS layers 520 overlying substrate 510) having at least a bond pad 522 and at least a top metal layer 521. The pressure sensor 540 can also have one or more via structures 541 coupled to the CMOS layers 520. Here, the two sensor devices have separate cavities.

In FIG. 5A, another sensor 542 is shown adjacent to the pressure sensor 540. This other sensor has a MEMS cap 544 formed overlying. The other sensor 542 can be a MEMS accelerometer, gyrometer, resonator, or other sensor device. The other sensor can also be a dummy or reference pressure sensor for differential measurement. In various embodiments, the other sensor can be co-fabricated with the pressure sensor and have a shared cavity or separate cavities. As shown, sensor 542 can include anchor structures 543. In an embodiment, sensor 542 can have a cavity 532 with a defined air pressure environment. In a specific embodiment, cavity 531 and 532 can have the same cavity pressure.

FIG. 5B is a simplified diagram illustrating a top view of an oxide layer 530 of the integrated pressure sensor device according to the embodiment of FIG. 5A. This oxide layer 530 shows two separate cavities. The cavity on the left is similar to that described for FIG. 1A and 1B, with two connected substantially circular regions. The cavity on the right is a substantially rectangular region. These two regions underlie the pressure sensor 540 and the other sensor 542, respectively.

FIG. 6A is a simplified diagram illustrating a cross-sectional view of an integrated pressure sensor device according to an embodiment of the present invention. This figure illustrates a method of fabricating an integrated pressure sensing device similar to that of FIG. 4A. Here, two pressure sensors 640 are shown, with the other sensor being the dummy or reference pressure sensor for differential measurement. The integrated pressure sensing device 600 includes a pressure sensor (diaphragm) 640 integrated overlying a processed CMOS substrate (CMOS layers 620 overlying substrate 610) having at least a bond pad 622 and at least a top metal layer 621. The pressure sensor 640 can also have one or more via structures 641 coupled to the CMOS layers 620. Here, the two sensor devices have connected cavities. The pressure sensor structure that is not exposed to ambient (enclosed in cap 644) can be the reference against the other pressure sensor to cancel out effects of temperature and stress independent of pressure.

FIG. 6B is a simplified diagram illustrating a top view of an oxide layer 630 of the integrated pressure sensor device according to the embodiment of FIG. 6A. This oxide layer 630 shows two cavity regions similar to that of FIG. 1A. Both have a larger circular region and a smaller circular region that are connected. Each of these circular region pairs are also connected by a straight path (shown in FIG. 6B).

FIG. 7A is a simplified diagram illustrating a cross-sectional view of an integrated pressure sensor device according to an embodiment of the present invention. This figure can represent a method of fabricating an integrated piezoresistive sensing device using a seal process with fusion bonding. The integrated pressure sensing device 700 includes a pressure sensor (diaphragm) 740 integrated overlying a processed CMOS substrate (CMOS layers 720 overlying substrate 710) having at least a bond pad 722 and at least a top metal layer 721. The pressure sensor 740 can also have one or more via structures 741 coupled to the CMOS layers 720. At least a piezoresistor 745 can be formed within a portion of the integrated pressure sensor 740. Those of ordinary skill in the art will recognize other variations, modifications, and alternatives.

As shown, a pressure sensor is formed overlying a CMOS substrate, which can be fabricated using a standard IC process, including bond pads and top metal layers. After patterning the top metal layer, an oxide layer 730 can be deposited and patterned. At least a region of the oxide layer 730 can be removed to create a cavity region 731.

A single crystalline silicon (SCS) wafer can be fusion bonded with the CMOS substrate within a vacuum chamber, which can form a vacuum in the cavity region 731 between the CMOS and the SCS layer. The SCS layer can be thinned down to about 20-30 um to form a diaphragm structure of a pressure sensor 740. An ion implantation process can be used to form heavily doped regions, such as p-type doped regions, to provide contact to metal regions.

Another ion implantation process can be used to form moderately doped regions, such as moderate p-type doped regions for piezoresistors. The SCS layer can be etched to create holes, which can be filled with metal materials 741 (ex. TiN and W) to form electrical connections between the SCS layer and the CMOS layer. The etching process can include a plasma etching, chemical vapor etching, deep reactive ion etching (DRIE), or other like process.

Figure 7B:
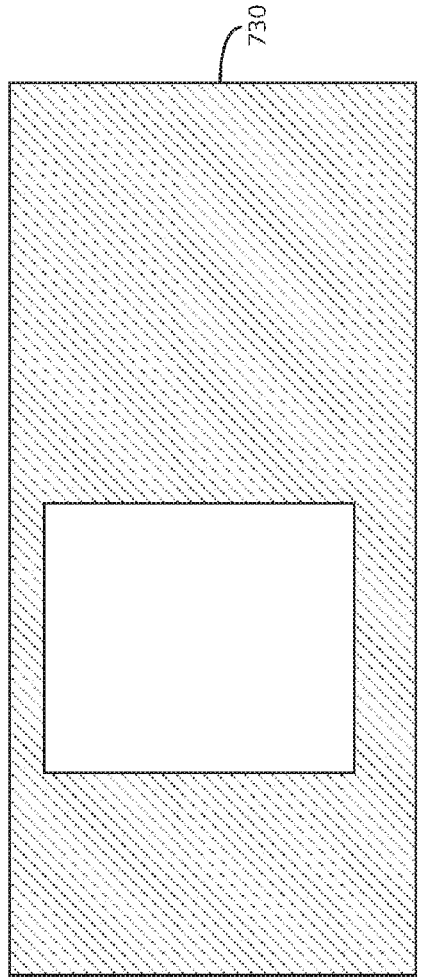
FIG. 7B is a simplified diagram illustrating a top view of an oxide layer of the integrated pressure sensor device according to the embodiment of FIG. 7A.

FIG. 7B is a simplified diagram illustrating a top view of an oxide layer 730 of the integrated pressure sensor device according to the embodiment of FIG. 7A. Here, the oxide layer 730 is shown with a substantially square region removed. This region corresponds to the region underlying the piezoresistors shown in FIG. 7A.

FIG. 8A is a simplified diagram illustrating a cross-sectional view of an integrated pressure sensor device according to an embodiment of the present invention. This figure can represent a method of fabricating an integrated piezoresistive sensing device using thin film sealing process. The integrated pressure sensing device 800 includes a pressure sensor (diaphragm) 840 integrated overlying a processed CMOS substrate (CMOS layers 820 overlying substrate 810) having at least a bond pad 822 and at least a top metal layer 821. The pressure sensor 840 can also have one or more via structures 841 coupled to the CMOS layers 820. At least a piezoresistor 845 can be formed within a portion of the integrated pressure sensor 840. Those of ordinary skill in the art will recognize other variations, modifications, and alternatives.

Here, the fabrication method incorporates the steps described for FIG. 7A and FIG. 2A. The process is similar to that described for FIG. 7A up to the etching of the MEMS silicon wafer or SCS layer. An ion implantation process can be used to form a heavily p-type doped region and another ion implantation process can be used to form a moderate p-type doped region. The SCS layer can be etched to form holes, some of which can be filled by TiN and W deposition to form contacts 841 to the metal layers.

Following the etching process, the cavity 831 of the pressure sensor is opened. In a specific embodiment, a dry cleaning process is used to remove a photo resist material used for the etching process. The cavity 831 can be sealed using a thin film deposition process, which determines the cavity pressure within the cavity region. The pressure and temperature of the deposition process can be less than about 1000 Pa and less than about 350 degrees Celsius. The thin film material can include PECVD (Plasma-enhanced chemical vapor deposition) silicon nitride or SiO2 or the like. The silicon nitride material can provide a good diffusion barrier.

FIG. 8B is a simplified diagram illustrating a top view of an oxide layer 830 of the integrated pressure sensor device according to the embodiment of FIG. 8A. The oxide layer 830 is shown with a substantially square region removed and a smaller substantially circular region removed. These regions are connected by a straight path. These regions correspond to the regions underlying the piezoresistors and the sealing layer, respectively.

Figure 9:
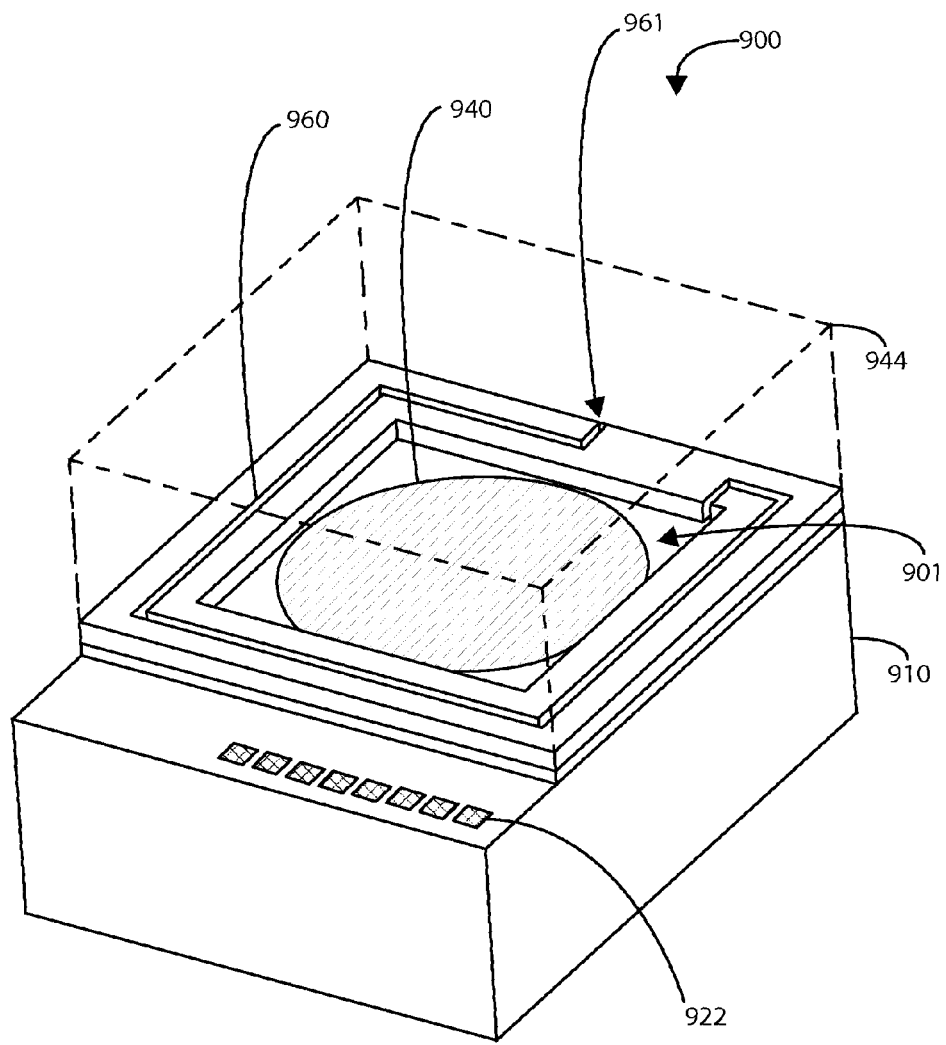
FIG. 9 is a simplified diagram illustrating a perspective view of an integrated pressure sensor device according to an embodiment of the present invention.

FIG. 9 is a simplified diagram illustrating a perspective view of an integrated pressure sensor device 900 according to an embodiment of the present invention. As shown, a cap structure 944 having at least one channel 960 can be formed overlying the pressure sensor 940 or combination of sensors. The at least one channel 960 can be an isolation input channel, which can have an input port 961 within a portion of the cap structure 944 and cavity port connected to cavity region 901 within the cap structure 944. In an embodiment, the cap 944 with channels can protect the membrane or diaphragm 940 of the pressure sensor from mechanical damage during a packaging assembly process. This membrane or diaphragm 940 can be formed by thinning a single crystalline silicon wafer overlying a CMOS substrate 910 having bond pads 922 as described previously in FIG. 1A. Of course, there can be other variations, modifications, and alternatives.

FIG. 10A is a simplified diagram illustrating a cross-sectional view of an integrated pressure sensor device according to an embodiment of the present invention. This figure can represent a cross-sectional view of the device shown in FIG. 9. The integrated pressure sensing device 1001 includes a pressure sensor (diaphragm) 1040 integrated enclosed in a cap structure 1044 and overlying a processed CMOS substrate (CMOS layers 1020 overlying substrate 1010) having at least a bond pad 1022 and at least a top metal layer 1021. The pressure sensor 1040 can also have one or more via structures 1041 coupled to the CMOS layers 1020.

In a specific embodiment, device 1001 can include an input port 1061 in the cap structure 1044 shows the entry to a channel (shown by the dotted lines) similar to channel 960 in FIG. 9. In an embodiment, the cap 944 with channels can protect the membrane or diaphragm 940 of the pressure sensor from mechanical damage during a packaging assembly process. This channel can be etched at the same time as the chamber for the pressure sensor. In a specific embodiment, the input port would be formed laterally, as shown in FIG. 10A. Those of ordinary skill in the art will recognize other variations, modifications, and alternatives.

As shown, a pressure sensor 1040 is formed overlying a CMOS substrate, which can be fabricated using a standard IC process, including bond pads 1022 and top metal layers 1021 and oxide layer 1030. Here, the oxide layer is part of the original CMOS layers 1020 and is shown out over the bond pad 1022. At least a region of the oxide layer 1030 overlying the top metal layers 1021 can be removed to create a cavity region 1031.

FIG. 10B is a simplified diagram illustrating a cross-sectional view of an integrated pressure sensor device according to an embodiment of the present invention. Device 1002 is the same as device 1001 in FIG. 10A without the cap structure 1044.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating an integrated pressure sensing device, the method comprising:
   providing a substrate member having a surface region;
   forming a CMOS IC layer overlying the surface region, the CMOS IC layer having a CMOS surface region;
   forming an oxide layer overlying the CMOS surface region, the oxide layer having an oxide surface region;
   removing at least a portion of the oxide layer to form at least a first cavity region;
   bonding a single crystalline silicon wafer overlying the oxide surface region to seal the first cavity region;
   thinning the single crystalline silicon wafer to a desired thickness;
   removing at least a portion of the single crystalline silicon wafer to form at least one connection path;
   depositing a metal material within the at least one connection path to form at least one via structure; and
   removing at least a second portion of the single crystalline silicon wafer to expose a cavity path coupled to the first cavity region, the removed second portion of the single crystalline silicon being outside the sealed first cavity region.

2. The method of claim 1 wherein the bonding of the single crystalline silicon wafer includes a fusion bonding process or a eutectic bonding process.

3. The method of claim 2 wherein the bonding of the single crystalline silicon wafer is performed in a vacuum chamber forming a vacuum in the cavity region.

4. The method of claim 1 further comprising forming a thin film material overlying the single crystalline silicon wafer and covering an opening of the cavity path.

5. The method of claim 4 wherein the thin film material substantially seals the cavity path.

6. The method of claim 4 wherein the thin film material substantially seals at least a diffusion path of the integrated pressure sensing device.

7. The method of claim 4 wherein the thin film material comprises a PECVD silicon nitride or a $SiO_2$ material.

8. The method of claim 1 forming a thin film material overlaying the single crystalline silicon wafer, wherein the thin film material is formed via a deposition process with a pressure <1000 Pa and a temperature <350 degrees Celsius.

9. The method of claim 1 wherein the metal material comprises TiN and W materials.

10. The method of claim 1 wherein the CMOS surface region includes a top metal layer, and the first cavity region in the oxide layer is disposed over a first region of the top metal layer.

11. The method of claim 1 further comprising removing a second portion of the oxide layer to form a second cavity region and a path connecting the first cavity region and the second cavity region, the second cavity region being outside the sealed first cavity region.

12. The method of claim 11 wherein the removed second portion of the single crystalline silicon is above the second cavity region to form the cavity path.

13. A method of fabricating an integrated pressure sensing device, the method comprising:
   providing a substrate member having a surface region;
   forming a CMOS IC layer overlying the surface region, the CMOS IC layer having a CMOS surface region;
   forming an oxide layer overlying the CMOS surface region, the oxide layer having an oxide surface region;
   removing at least a portion of the oxide layer to form at least a cavity region;
   bonding a single crystalline silicon wafer overlaying the oxide surface region to seal the cavity region;
   thinning the single crystalline silicon wafer to a desired thickness;
   removing at least a portion of the single crystalline silicon wafer to form at least one connection path;
   depositing a metal material within the at least one connection path to form at least one via structure; and
   removing at least a portion of the single crystalline silicon wafer to form a cavity path coupled to the cavity region;
   the method-further comprising:
   a first ion implantation process to form a heavily p-type doped region within a first portion of the single crystalline silicon wafer; and
   a second ion implantation process to form a heavily p-type doped region within a second portion of the signal crystalline silicon wafer.

14. A method of fabricating an integrated pressure sensing device, the method comprising:
   providing a substrate member having a surface region;
   forming a CMOS IC layer overlying the surface region, the CMOS IC layer having a CMOS surface region, the CMOS region includes a top metal layer;
   forming an oxide layer overlying the CMOS surface region, the oxide layer having an oxide surface region;
   removing at least a portion of the oxide layer to form at least a first cavity region, the first cavity region in the oxide layer being disposed over a region of the top metal layer;

bonding a single crystalline silicon wafer overlying the oxide surface region to seal the first cavity region;

thinning the single crystalline silicon wafer to a desired thickness;

removing at least a portion of the single crystalline silicon wafer to form at least one connection path;

depositing a metal material within the at least one connection path to form at least one via structure; and removing a second portion of the oxide layer to form a second cavity region and a path connecting the first cavity region and the second cavity region, the second cavity region being outside the sealed first cavity region.

15. The method of claim 14 further comprising removing a second portion of the single crystalline silicon wafer to over the second cavity region to form a cavity path coupled to the first cavity region, the removed second portion of the single crystalline silicon being outside the sealed first cavity region.

16. The method of claim 14 further comprising forming a MEMS (micro-electrical-mechanical-system) sensor over the second cavity region.

17. The method of claim 16 further comprising forming a cap structure overlying another sensor, the cap structure having a cap cavity region.

18. The method of claim 17 wherein the forming of the cap structure includes a eutectic bonding process to substantially seal the cavity path.

19. The method of claim 17 wherein the forming of the MEMS sensor from the second portion forming a cavity path, the cap cavity region being connected to the cavity region via the cavity path.

20. The method of claim 17 wherein the cap cavity region is separated from the cavity region.

21. The method of claim 17 wherein the cap structure comprises at least one isolation input channel having an input port, the isolation input channel being configured to protect the pressure sensor from mechanical damage.

22. The method of claim 16 wherein the MEMS sensor comprises one or more of an accelerometer, a gyro sensor, a resonator, a magnetic field sensor, a pressure sensor, or a reference pressure sensor.

* * * * *